United States Patent
Hung et al.

(10) Patent No.: US 6,380,096 B2
(45) Date of Patent: Apr. 30, 2002

(54) IN-SITU INTEGRATED OXIDE ETCH PROCESS PARTICULARLY USEFUL FOR COPPER DUAL DAMASCENE

(75) Inventors: Hoiman Hung, San Jose; Joseph P Caulfield, Oakland; Sum-Yee Betty Tang; Jian Ding, both of San Jose; Tianzong Xu, Mountain View, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/201,590

(22) Filed: Nov. 30, 1998

Related U.S. Application Data

(63) Continuation-in-part of application No. 09/149,810, filed on Sep. 8, 1998, which is a continuation-in-part of application No. 09/112,094, filed on Jul. 9, 1998.

(51) Int. Cl.$^7$ .................................. H01L 21/302
(52) U.S. Cl. .................. 438/723; 438/724; 438/743; 438/744; 438/906; 438/954; 216/39; 216/72; 216/80
(58) Field of Search ................... 216/18, 39, 67, 216/68, 72, 80; 252/79.1; 438/695, 714, 723, 724, 743, 744, 905, 906, 954, 963, 976

(56) References Cited

U.S. PATENT DOCUMENTS

| | | | |
|---|---|---|---|
| 5,143,820 A | * | 9/1992 | Kotecha et al. ............. 430/314 |
| 5,744,293 A | * | 4/1998 | Okumura et al. ........... 430/512 |
| 5,843,847 A | * | 12/1998 | Pu et al. ..................... 438/723 |
| 5,910,453 A | * | 6/1999 | Gupta et al. ................ 438/717 |

(List continued on next page.)

FOREIGN PATENT DOCUMENTS

EP 0 721 205 A2 * 7/1996 ........... H01L/21/00

Primary Examiner—Randy Gulakowski
Assistant Examiner—Allan Olsen
(74) Attorney, Agent, or Firm—Charles S. Guenzer; Joseph Bach

(57) ABSTRACT

An integrated in situ oxide etch process particularly useful for a counterbore dual-damascene structure over copper having in one inter-layer dielectric level a lower nitride stop layer, a lower oxide dielectric, a lower nitride stop layer, an upper oxide dielectric layer, and an anti-reflective coating (ARC). The process is divided into a counterbore etch and a trench etch with photolithography for each, and each step is preferably performed in a high-density plasma reactor having an inductively coupled plasma source primarily generating the plasma and a capacitively coupled pedestal supporting the wafer and producing the bias power. The counterbore etch preferably includes at least four substeps of opening the ARC, etching through the upper oxide and nitride layers, selectively etching the lower oxide layer but stopping on the lower nitride layer, and a post-etch treatment for removing residue. The trench etch preferably includes the five substeps of opening the ARC, etching through the upper oxide layer but stopping on the upper nitride layers, a first post-etch treatment for removing residue, a nitride removal of the exposed portions of the upper and lower nitride layers, and a second post-etch treatment for remaining further residues. The oxide etches selective to nitride are accomplished using a fluorocarbon chemistry with high bias and a high temperature for a silicon-based scavenger for fluorine placed next to the plasma. The nitride etches and removal are accomplished by adding an oxygen-containing gas to a fluorocarbon. The final nitride removal is accomplished with very low bias power to increase selectivity to nitride and reduce sputtering of the underlying copper. The post-etch treatments are oxygen plasmas with zero bias power.

24 Claims, 6 Drawing Sheets

U.S. PATENT DOCUMENTS

| | | | | |
|---|---|---|---|---|
| 5,935,762 A | * | 8/1999 | Dai et al. | 430/312 |
| 5,965,463 A | * | 10/1999 | Cui et al. | 438/723 |
| 5,994,227 A | * | 11/1999 | Matsuo et al. | 438/696 |
| 5,997,757 A | * | 12/1999 | Nagayama et al. | 216/38 |
| 6,027,959 A | * | 2/2000 | En et al. | 438/142 |
| 6,037,213 A | * | 3/2000 | Shih et al. | 438/253 |
| 6,037,266 A | * | 3/2000 | Tao et al. | 438/719 |
| 6,051,504 A | * | 4/2000 | Armacost et al. | 438/706 |
| 6,057,247 A | * | 5/2000 | Imai et al. | 438/714 |
| 6,090,697 A | * | 7/2000 | Xing et al. | 438/618 |

\* cited by examiner

IN-SITU INTEGRATED OXIDE ETCH PROCESS PARTICULARLY USEFUL FOR COPPER DUAL DAMASCENE

RELATED APPLICATIONS

This application is a continuation in part of Ser. No. 09/149,810 filed Sep. 8, 1998, which is a continuation in part of Ser. No. 09/112,094 filed Jul. 9, 1998. This application is also related to Ser. No. 09/112,864 filed Jul. 9, 1998.

FIELD OF THE INVENTION

The invention relates to plasma etch processes used in the manufacture of semiconductor integrated circuits. In particular, the invention relates to an in situ integrated process for etching layered dielectric structures serving as inter-level dielectric layers.

BACKGROUND ART

The technology of fabricating semiconductor integrated circuits continues to advance in the number of transistors, capacitors, or other electronic devices which can be fabricated on a single integrated circuit chip. This increasing level of integration is being accomplished in large part by decreasing the minimum feature sizes. Even as the number of layers in the integrated circuit continues to increase, advanced processes are being developed which allow for a reduction in the number of processing steps for a functional layer. However, these advanced processes often make extraordinary demands upon the chemistry of the etching process. Dielectric etching has presented some of the most difficult demands.

In the past the common materials for inter-level dielectric have been based upon silicon, such as silicon dioxide, silica glass such as BPSG, and related silicon-based oxide materials that serve as electrical insulators. Recently, interest has developed in insulating materials with low dielectric constants (low-k dielectrics), some of which are based upon silicon but others are based upon carbon.

Advanced integrated circuits contain multiple wiring layers separated from the silicon substrate and from each other by respective dielectric layers. Particularly logic circuitry, such as microprocessors, require several layers of metallization with intervening inter-level dielectric layers. Small contact or via holes need to be etched through each of the dielectric layers. The contact or via holes are then filled with a conductor, composed typically of aluminum in the past but more recently composed of copper. A horizontal wiring layer is formed over one dielectric layer and then covered by another dielectric layer. The horizontal wiring and the underlying vias are often referred to as a single wiring layer. The conventional process not only fills the contact or via holes but also overfills them to form a thick planar layer over both the filled holes and the dielectric. Conventionally, a metal lithographic step then photographically defines a photoresist layer over the planar metal layer and etches the exposed metal into a network of conductive interconnects.

In contrast, a recently developed damascene process substitutes chemical mechanical polishing for metal etching. A dual-damascene structure, as illustrated in sectioned orthographic view in FIG. 1, has been proposed for advanced chips which avoids the metal etching and combines the metallization of the via and horizontal interconnect. There are two general types of dual-damascene processes, self-aligned and counterbore, both of which produce the structure of FIG. 1.

A substrate 10 includes a conductive feature 11 in its surface. If the substrate 10 already includes a wiring level at its surface, the conductive feature 11 is metallic and may be a previously formed dual-damascene metallization. The interconnection between two metallic wiring levels is called a via. Conventionally, the metal forming the metallization has been aluminum and its alloys, but advanced integrated circuits are being designed with copper metallization. Alternatively, the conductive feature 11 may be a doped region in a silicon substrate 10, for example, a source or drain. In this case, the interconnection between the silicon layer and a first metallization layer is called a contact. Although some aspects of the present invention apply to contacts, the major portion of the disclosure and the details of the invention are directed to vias, particularly copper vias and underlying copper lines 11.

Over the substrate 10 and the included conductive feature 11 are deposited a lower stop layer 12, a lower dielectric layer 14, an upper stop layer 16, and an upper dielectric layer 20. The stop layers 12, 16 have compositions relative to those of the dielectric layers 14, 20 such that an etch chemistry is available which effectively etches a vertical hole in the overlying dielectric layer 14, 20 but stops on the stop layer 12, 16. That is, the etch selectively etches the dielectric layer over the stop layer. Alternatively stated, the dielectric etch is selective to the stop material. As mentioned before, more advanced circuits are being designed with the two dielectric layers 14, 16 being composed of a dielectric material having a lower dielectric constant than that of silicon dioxide. However, the specific examples of the invention use silicon dioxide, related non-stoichiometric materials $SiO_x$, and related silica glasses for the dielectric. Some related glasses are borophosphosilicate glass (BPSG) and fluorinated silica glass (FSG), which exhibit much the same chemistry as $SiO_2$. These materials will be hereafter collectively be referred to as oxides. The typical stop material for oxide is silicon nitride ($Si_3N_4$) although non-stoichiometric ratios $SiN_x$, are included where x may be between 1.0 and 1.5. These materials will hereafter be referred to as nitrides. An advantage of the combination of oxide and nitride is that the both materials can be grown in a single reactor by plasma-enhanced chemical vapor deposition (PECVD). For example, silicon dioxide is grown under PECVD using tetraorthosilicate (TEOS) as the main precursor gas. Silicon nitride can be grown in the same reactor using silane as the main precursor in the presence of a nitrogen plasma. These examples are non-limiting and simply show the advantage of the vertical structure.

The dual-damascene etch structure shown in FIG. 1 is formed in the previously described vertical structure. The discussion with respect to the invention will disclose at least one way of performing the dual-damascene etch. The result is that a generally circular via hole 18 is etched through the lower oxide layer 14 and the lower nitride stop layer 12 to reach the underlying conductive feature 11. Multiple such via holes 18 are etched to reach different ones of the conductive features 11. A trench 22 extending along the surface of the substrate 10 is etched through at least the upper oxide layer 20 and usually through the upper nitride stop layer 16.

After completion of the dual-damascene etch structure of FIG. 1, the trench 22 and vias 18 are filled with a metal such as aluminum or copper. Physical vapor deposition (PVD) is the usual process for depositing the metal though it may be combined with chemical vapor deposition (CVD) or replaced by electro or electroless plating. Barrier layers are usually first conformally coated in the hole being filled. A typical barrier for copper includes Ta/TaN. The metal is deposited to a thickness that overfills the trench 22 and also covers a top planar surface 30 of the upper oxide layer 30. Chemical mechanical polishing (CMP) is applied to the top surface of the wafer. CMP removes the relatively soft exposed metal but stops on the relatively hard oxide layer 20. The result is a horizontal metal interconnect within the trench 22 and multiple vertical metal interconnects (vias) in the via holes 18.

In the past, equipment limitations have required the frequent transfer of a semiconductor integrated circuit wafer being process from one vacuum processing chamber to another. Exposure of the wafers to the air environment during the transfer between vacuum chambers often results in corrosion of the metal features of the partially processed integrated circuit. The well known susceptibility of copper to corrosion in air increases the destructive risk. Also, carbon-based residue that forms on the interior of the reactor chamber over time can redeposit on exposed copper surfaces. Since these carbon based residues can be extremely difficult to remove from copper, their presence can adversely impact upon subsequent formation of electrical contacts to the copper.

Tang et al. and Hung et al. in the previously cited patent applications, incorporated herein by reference in their entireties, disclose an integrated counterbore process for etching the dual-damascene structure of FIG. 1. The process is particularly advantageous because it can be performed in a single etch reactor, such as the inductive plasma source (IPS) etch reactor available from Applied Materials of Santa Clara, Calif. This reactor is illustrative of a new class of inductively coupled plasma reactors that are capable of generating a high-density plasma (HDP) and which separate the generation of the plasma from the biasing of the pedestal supporting the wafer. Such a reactor provides both the selectivity and the process flexibility required to satisfy the conflicting requirements of the many steps of an integrated in situ process. There are other types of high-density plasma reactors, including remote plasma source (RPS) and electron-cyclotron resonance (ECR). A high-density plasma may be defined as a plasma filling the entire space it is in, excluding plasma sheaths, and having an ionization density of at least $10^{11}$ cm$^{-3}$.

Collins et al. have described the IPS etch reactor in U.S. patent application Ser. No. 08/733,554, filed Oct. 21, 1996. The general reactor structure and some auxiliary equipment are illustrated in partial cross section in FIG. 2. A wafer 40 to be processed is supported on a cathode pedestal 42, which is supplied with RF power from a first RF power supply 44. A silicon ring 46 surrounds the pedestal 42 and is controllably heated by an array of heater lamps 48. A grounded silicon wall 50 surrounds the plasma processing area. A silicon roof 52 overlies the plasma processing area, and lamps 54 and water cooling channels 56 control its temperature. The temperature-controlled silicon ring 86 and to a lesser extent the silicon roof 52 can be used to scavenge fluorine from the fluorocarbon or other fluorine-based plasma. Processing gas is supplied from one or more bottom gas feeds 54 through a bank of mass flow controllers 56. Alternatively, a top gas feed may be formed as a small showerhead in the center of the silicon roof 52. An unillustrated vacuum pumping system connected to a pumping channel 58 around the lower portion of the chamber maintains the interior of the chamber at a preselected pressure. A system controller 60 controls the operation of the reactor and its auxiliary equipment.

In the used configuration, the silicon roof 52 is grounded, but its semiconductor resistivity and thickness are chosen to pass generally axial RF magnetic fields produced by an inner inductive coil stack 66 and an outer inductive coil stack 68 powered by respective RF power supplies 70, 72. Alternatively, a single RF power supply may be used in conjunction with a selectable power splitter. Other coil configurations are possible, for example, as in the TCP reactor having a flat, spiral inductive coil overlying the roof 52.

The system controller 60 controls the mass flow controllers 56, the heater lamps 48, 54, the supply of chilled water to the cooling channels 56, the throttle valve to the vacuum pumps, and the power supplies 44, 70, 72. All these regulated functions control the etching chemistry in conformance to a process recipe of the sort to be described in the examples below. The process recipe is stored in the controller 60 in magnetic, optical, or semiconductor memory, as is well known in the art, and the controller 60 reads the recipe from a recording medium inserted into it. It is typical for the equipment supplier to provide recipes on magnetic media such as floppy disks or optical media such as CDROMs, which are then read into controller 60.

A principal advantage of the inductively coupled plasma reactor is that different amounts of power can be supplied to the inductive coils 66, 68 and to the capacitive pedestal 42. The inductive power creates a plasma source region located in large part remotely from the wafer 40 while the capacitive power controls the plasma sheath adjacent to the wafer 40 and thus determines the DC bias across the sheath at the wafer 40. The source power can be raised to increase the etching rate and control the number and type of excited radicals while the bias power can be varied to cause ions to be accelerated across the plasma sheath with either high or low energy and which then strike the wafer 40 with the selected energy.

The integrated counterbore dual-damascene etch process of Tung et al. and Hung et al. as practiced in the IPS reactor is summarized in FIG. 3. In step 74, all the dual-damascene layers 12, 14, 16, 20 are grown in a horizontally unpatterned vertical structure. All the layers can be grown in a single CVD chamber by sequentially changing gas flows, power levels, and other reactor parameters. In step 76, a photoresist layer is deposited over the upper oxide layer 20 and patterned with apertures corresponding to the via holes 18.

In step 78, an extended via hole is etched from the top of the upper oxide layer 20 to the top of the lower nitride stop layer 12. Because the counterbore via etch 78 must etch through the upper nitride stop layer 16 but stop on the lower nitride stop layer 12, a multi-step via etch is required. Tang et al. disclose both a two-substep and a three-substep via etch step 74. The parameters for the two-substep via etch are given in TABLE 1.

TABLE 1

|  | First Substep | Second Substep |
| --- | --- | --- |
| CHF$_3$ Flow (sccm) | 80 | 80 |
| C$_2$F$_6$ Flow (sccm) | 10 | 10 |
| CO Flow (sccm) | 15 | 0 |
| Ar Flow (sccm) | 425 | 425 |
| Inner Source Power (W) | 710 | 710 |
| Outer Source Power (W) | 2310 | 2310 |
| Bias Power (W) | 1400 | 1400 |
| Pressure (mTorr) | 75 | 75 |
| Roof Temp. (° C.) | 145 | 145 |
| Ring Temp. (° C.) | 350 | 350 |
| Cathode Temp. (° C.) | −10 | −10 |

TABLE 1-continued

|  | First Substep | Second Substep |
|---|---|---|
| Backside He Pressure (Torr) | 15 | 15 |
| Time (s) | 60 | 80 |

The counterbore via etch is demanding because it must etch very deeply, for example, 2.5 μm through a very narrow hole. A hole width of no more than 0.25 μm is required, and a width of 0.18 μm and less is being contemplated. These very high aspect ratios mean that etch stop is a problem. Etch stop arises from the fact that the high selectivity of fluorocarbon-based oxide etches to underlying silicon or silicon nitride as well as verticality of the side walls depend upon a polymer depositing on non-oxide surfaces and on the side walls. However, if the etching chemistry is too rich (favoring too much polymer formation), the polymer bridges the sidewalls and covers the oxide bottom of the developing hole and prevents further etching. The final step of the counterbore via etch also requires good selectivity to the underlying lower nitride stop layer 12. The use of CO in the first step reduces selectivity to nitride, thus allowing the upper nitride stop layer 16 to be etched.

An alternative three-step etch of Tang et al., particularly applicable to a wider geometry is summarized in TABLE 2.

TABLE 2

|  | First Substep | Second Substep | Third Substep |
|---|---|---|---|
| $CHF_3$ Flow (sccm) | 90 | 90 | 80 |
| $CH_2F_2$ Flow (sccm) | 10 | 10 | 0 |
| CO Flow (sccm) | 0 | 15 | 0 |
| $C_4F_8$ Flow (sccm) | 0 | 0 | 10 |
| Ar Flow (sccm) | 425 | 425 | 425 |
| Inner Source Power (W) | 610 | 610 | 610 |
| Outer Source Power (W) | 2100 | 2310 | 2310 |
| Bias Power (W) | 1400 | 1400 | 1400 |
| Pressure (mTorr) | 75 | 75 | 75 |
| Roof Temp. (° C.) | 145 | 145 | 145 |
| Ring Temp. (° C.) | 350 | 350 | 350 |
| Cathode Temp. (° C.) | −10 | −10 | −10 |
| Backside He Pressure (Torr) | 15 | 15 | 15 |
| Time (s) | 70 | 50 | 60 |

It begins with an oxide etch selective to nitride that goes no further than the upper nitride stop layer. The second step is less selective to nitride, allowing the upper nitride stop layer to be etched through. The third step is again selective to nitride so it etches through the lower oxide layer and stops on the lower nitride stop layer. This process allows tighter control on where the different steps begin and end.

At the completion of the via etch sequence, the wafer is removed from the etch reactor, and in step 80 a photoresist layer is deposited over the top of the upper oxide layer 30 and patterned to the area of the trench 22. The wafer is returned to the same or another IPS reactor.

In a trench etch step 82, the upper oxide layer 20 is etched down to the upper nitride stop layer 16, thereby forming the trench 22. After the trench etch 82, a post etch treatment 84 is used in the IPS chamber to remove any remaining photoresist and any polymer produced in the trench etch 82. This step is sometimes referred to as ashing. Finally, in a nitride removal step 86, the lower nitride layer 12 exposed at the bottom of the via hole 18 is removed.

Hung et al. give an example of the three steps 82, 84, 86, as summarized in TABLE 3.

TABLE 3

|  | Trench Etch | Ash | Nitride Removal |
|---|---|---|---|
| $C_4F_8$ Flow (sccm) | 14 | 0 | 0 |
| $CH_2F_2$ Flow (sccm) | 0 | 0 | 40 |
| $O_2$ Flow (sccm) | 0 | 400 | 60 |
| Ar Flow (sccm) | 100 | 0 | 100 |
| Inner Source Power (W) | 260 | 800 | 420 |
| Outer Source Power (W) | 1040 | 2400 | 1320 |
| Bias Power (W) | 1400 | 150 | 150 |
| Pressure (mTorr) | 7 | 60 | 9 |
| Roof Temp. (° C.) | 180 | 180 | 180 |
| Ring Temp. (° C.) | 270 | 270 | 270 |
| Cathode Temp. (° C.) | −10 | −10 | −10 |
| Backside He Pressure (Torr) | 15 | 15 | 15 |
| Time (s) | 100 | 60 | 100 |

In the trench etch step 82, a fluorocarbon-based etch is used to etch the upper oxide layer 20 but to stop on the upper nitride stop layer 16. The trench etch is not prone to etch stop because of the relatively open trench geometry. However, the trench etch must be very selective to nitride because the lower nitride stop layer 12 is exposed to the entire duration of the trench etch. Selectivity of oxide over nitride is achieved by the combination of a fluorocarbon chemistry and a relatively high bias power producing energetic ions for reactive ion etching. The relatively high ring temperature and low wafer temperature also foster good selectivity. If the lower nitride stop layer 12 were to be punched through in the trench etch, the relatively high ion energies used to achieve oxide-to-nitride selectivity would sputter the copper thus exposed in the underlying copper metallization 11. The copper would redeposit on the sidewalls of the via hole 18 and significantly degrade the electric characteristics of the inter-level oxide. Note that in copper PVD, barrier layers are deposited in the via hole 18 and trench 22 prior to the copper deposition to prevent the copper from migrating into the oxide.

The post etch treatment 84 uses an oxygen-based plasma at relatively low bias power, typically less than 20% of that used in the selective etch. The nitride removal 82 uses a combination of a fluorocarbon and an oxygen component at similarly low bias power to reduce the selectivity to nitride. The low bias power prevents significant sputtering of the exposed copper.

Both the counterbore via etch of Tang et al. and the trench etch of Hung et al. are respective in situ processes performable in a single reactor without removing the wafer from the reactor. Such an in situ process greatly increases through put because less wafer transfer is required and thermal and significant pressure ramps are not required between the substeps. Nonetheless, the process produces good structural characteristics.

However, further work has revealed some shortcomings of the processes described above and need for further capabilities.

The photolithography required for features of size approximately 0.25 μm and smaller is extremely demanding since even the far ultraviolet light used in advanced lithography has a wavelength not much different from this dimension, and photoresist thicknesses tend to be even greater to achieve good light absorption. Unless the photolithographic light is well coupled into the photoresist layer, standing waves may be set up in the photoresist layer. Thin photoresist layers may be used that are patterned by scanned electron beams, but e-beams are not considered amendable to high-volume production. Therefore, for the desired smaller feature sizes, it becomes necessary to apply an anti-reflective coating (ARC) between the top of the dielectric layers and beneath the photoresist. Two types of anti-reflective coatings are common. A dielectric anti-reflective coating (DARC) is composed of silicon oxynitride and may be deposited in the same plasma-enhanced CVD reactor as the other layers in the dual-damascene stack. A bottom anti-reflection coating (BARC) is a carbonaceous polymer similar to photoresist that begins as an organic suspension that is spun onto the wafer as a very thin layer and dried to form the polymeric layer having an advantageous refractive index. An example of BARC is BARLi, available from Hoechst Celanese. The integrated process needs to include the opening of the ARC layer in one or both of the etch steps.

Typically in the prior art, after a wafer has been subjected to a complete plasma etching step, it is wet cleaned with a commercially available cleaning solvent such as EKC for aluminum or ACT for copper to remove polymeric and other residues prior to the next step of lithography, PVD, or CVD. Although wet cleaning is relatively effective at providing clean surfaces for the next step, it is a slow and labor-intensive process inconsistent with the trend to automated, clean-room processing. It is thus desirable to substitute for the wet clean a final plasma clean in the integrated etch process.

The final nitride removal step of Hung et al. has been observed to side etch the lower nitride stop layer and thus to undercut the lower oxide layer. Such undercutting is not desirable. It is difficult for the conformal sputtering barrier layer to fill such small lateral recess, and if copper does fill it, the underlying oxide is unprotected. If the recess leaves voids in the PVD deposited metal, reliability is reduced.

SUMMARY OF THE INVENTION

The invention may be summarized as an in situ integrated etch process for etching oxide and other inter-level dielectrics. The process may be performed in a single chamber for all the necessary etching substeps in one level of etching, for example, including opening an anti-reflective coating and doing a final plasma clean as well as etching the dielectric and stop layer. The invention is particularly useful when a dielectric layer is underlaid with a stop layer, for example, an oxide dielectric and a nitride stop.

The invention is particularly applicable to a dual-damascene etch requiring two photolithographic steps and concomitant etching steps. A counterbore via etch etches a via hole through two levels of dielectric and an intervening stop layer but stops on the lower stop layer. A subsequent trench etch etches a larger feature in the upper dielectric layer and also includes a final stop removal and post-etch treatment. Oxide and nitride are the preferred materials for the dielectric and stop.

An aspect of the invention includes after the principal dielectric etch a first post-etch treatment, a stop removal step, and a subsequent short second post-etch treatment. This is especially important when a copper metallization is being exposed beneath the stop layer.

DETAILED DESCRIPTION OF THE PREFERRED EMBODIMENTS

Figure 1:
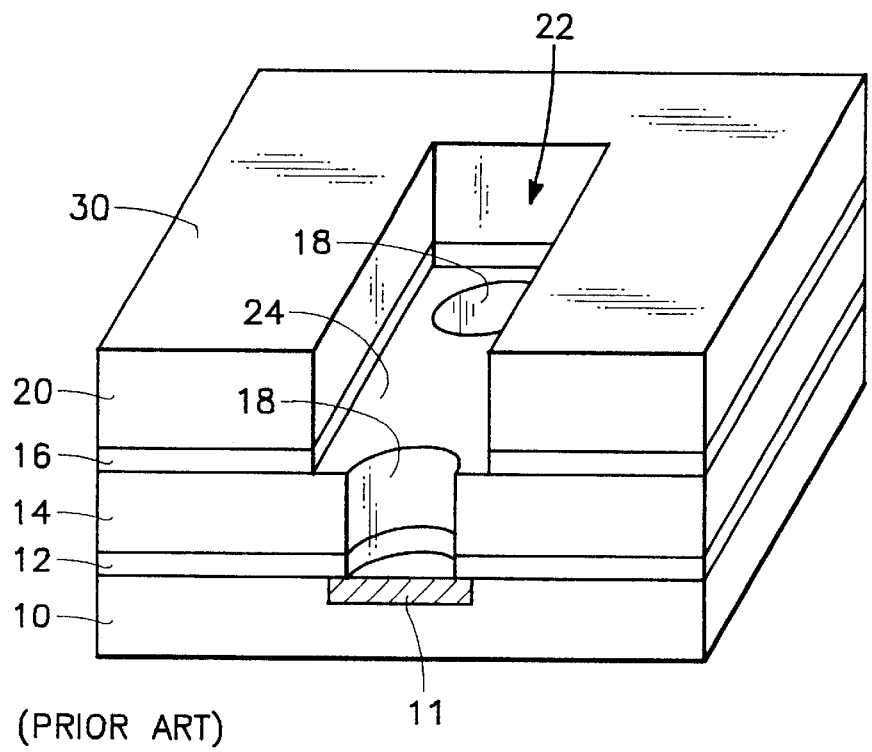
FIG. 1 is an orthographic view of a dual-damascene etch structure used for vertically connecting two levels of metallization and for horizontally connecting one metallization level.
Figure 3:
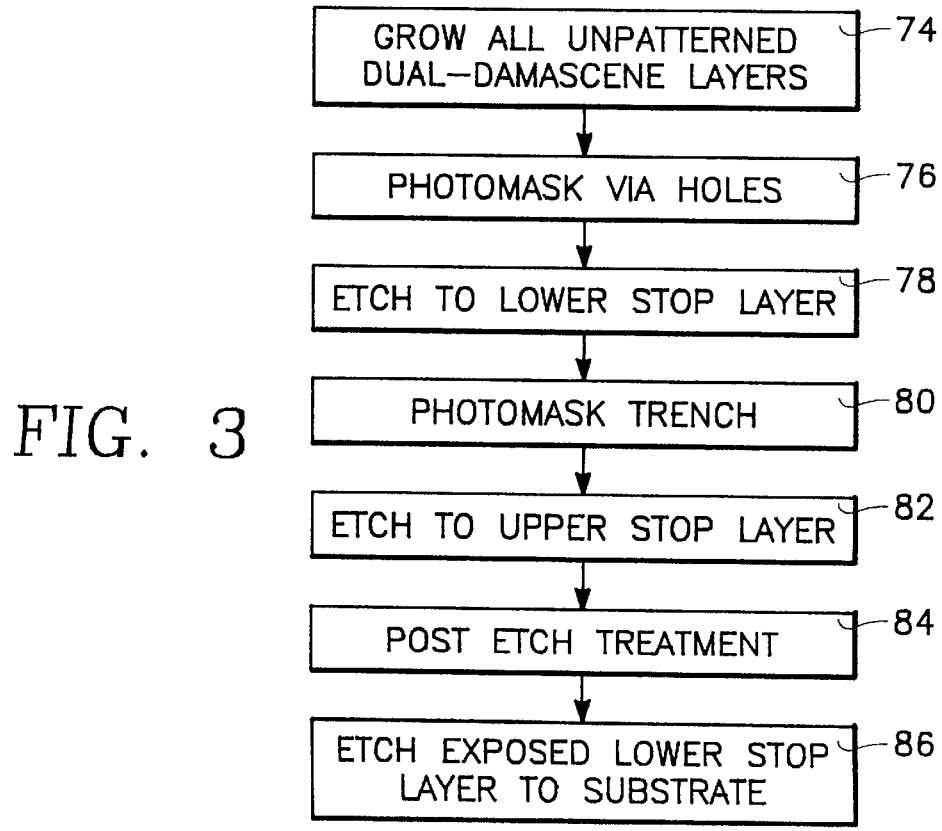
FIG. 3 is a process flow diagram for a counterbore dual-damascene integrated etch process disclosed in the parent application.
Figure 2:
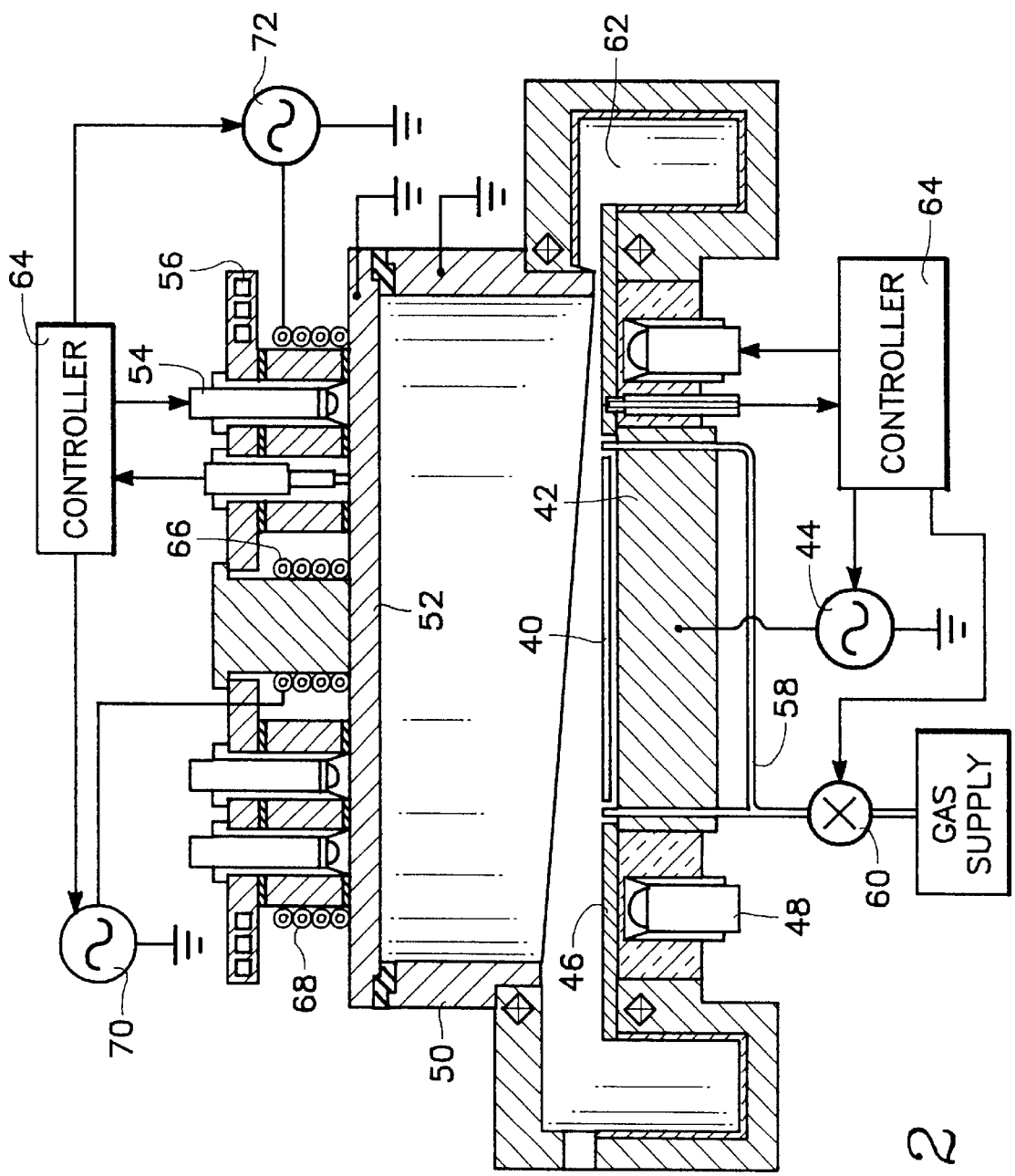
FIG. 2 is a schematic side view of an inductively coupled high-density plasma etch reactor usable with the inventive process.
Figure 4:
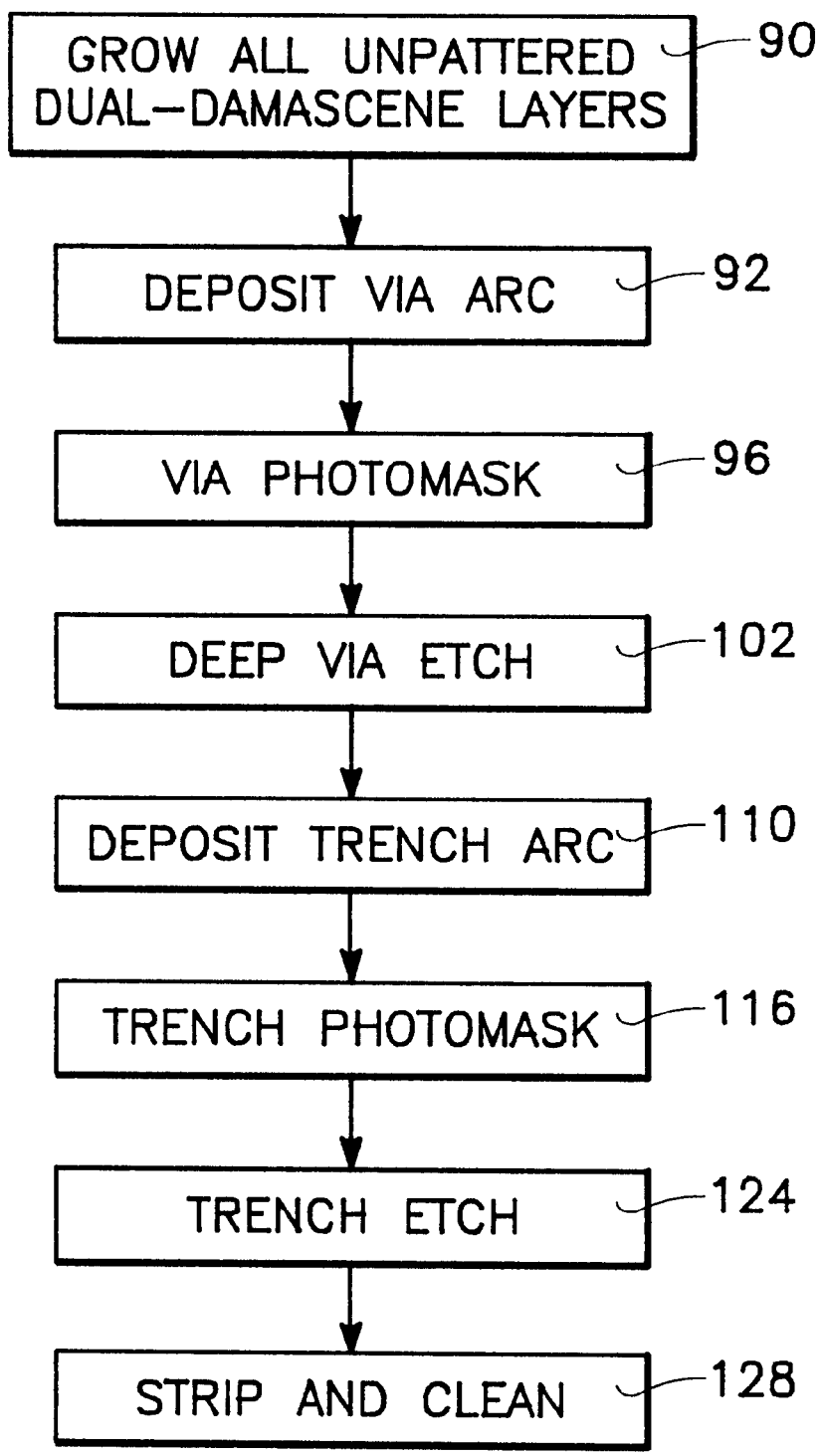
FIG. 4 is a process flow diagram for an improved dual-damascene integrated etch process of the invention.

The invention provides an etch process particularly useful for a counterbore dual-damascene etch although it can advantageously be applied to other via and contact structures. The process illustrated in the flow diagram of FIG. 4 will be explained with reference to the cross-sectional views of FIGS. 5 through 10 illustrating the gradually developing dual-damascene structure. Although the description will specifically described oxide dielectric layers and nitride stop layer, the broader aspects of the invention are applicable to other combinations of materials.

Figure 5:
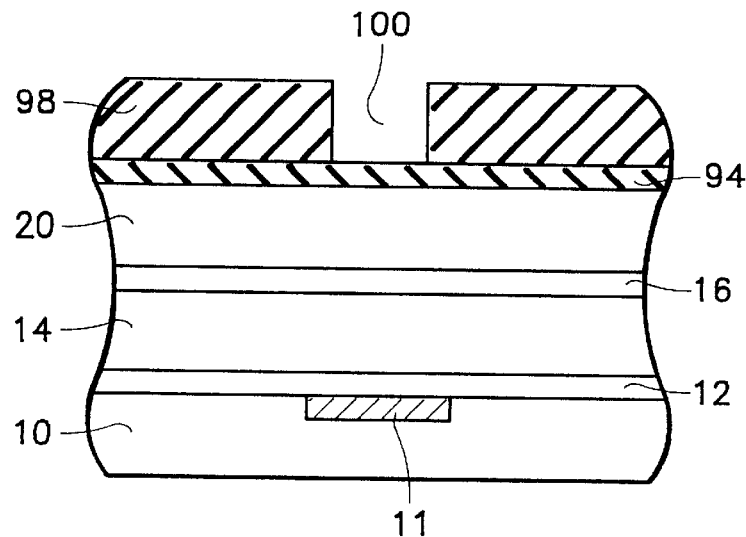
FIGS. 5 through 10 are cross-sectional views of the developing structure in a counter-bore dual-damascene process, especially the etching, of the invention.

In deposition step 90, all the dual-damascene layers 12, 14, 16, 20 of FIG. 5 are grown on the substrate 10, specifically the upper and lower oxide layers 20, 16 and the upper and lower nitride stop layer 16, 12. It is understood that in the case of a via, the substrate 10 includes a conductive line 11 composed of either aluminum or copper. As mentioned previously, all these layers 12, 14, 16, 20 may be sequentially grown in a single CVD chamber, thus simplifying the growth process. However, other growth processes are included within the invention.

The invention has been tested in one series of experiments upon a specific counter-bore dual damascene structure. It vertical structure is given in TABLE 4. The photoresist used for both the via and trench mask is sensitive to KrF laser light. The anti-reflection coating applied for both the via and trench photolithography is organic BARC. The oxide layers is grown by PECVD using TEOS as the principal precursors. The nitride layers are also grown by PECVD. The width of the via was varied between 0.25 and 1 $\mu$m, while the critical dimension of the trench was varied between 0.25 and 1.3 $\mu$m.

TABLE 4

|  | Thickness (nm) |
| --- | --- |
| KrF Photoresist | 600 |
| Organic BARC | 60 |
| Oxide | 400 |
| Nitride | 100 |
| Oxide | 400 |
| Nitride | 100 |
| Copper | |

Figure 6:
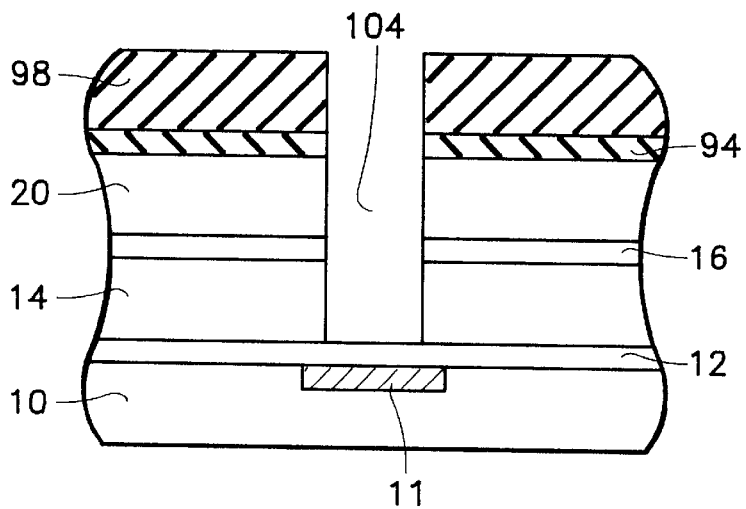

In step 92, an anti-reflection coating (ARC) 94 is deposited over the horizontally undefined upper oxide layer. If the ARC 94 is silicon oxynitride, it too may be grown in the same CVD chamber. If, however, the ARC 94 is BARC, it is spun on and dried in a separate processing station, perhaps together with the photoresist. Thereafter, in a via photo-masking step 96, a layer of photoresist 98 is spun on and dried and is photographically exposed and developed to form a photomask including a via mask aperture 100 overlying the metal line 11 and defining the via hole to be later etched. In a via etch step 102, a biased fluorocarbon chemistry is used to selectively etch, as illustrated in FIG. 6, an extended via hole 104 down to the lower nitride stop layer 12. This etch must extend through the anti-reflective coating 94, the upper oxide layer 20, the upper nitride stop layer 16, and the lower oxide layer 14, but stop on the lower nitride stop layer 12. The via etch step 102 is an important part of the invention and will be explained in more detail later and includes multiple substeps for the different levels being encountered.

Figure 7:
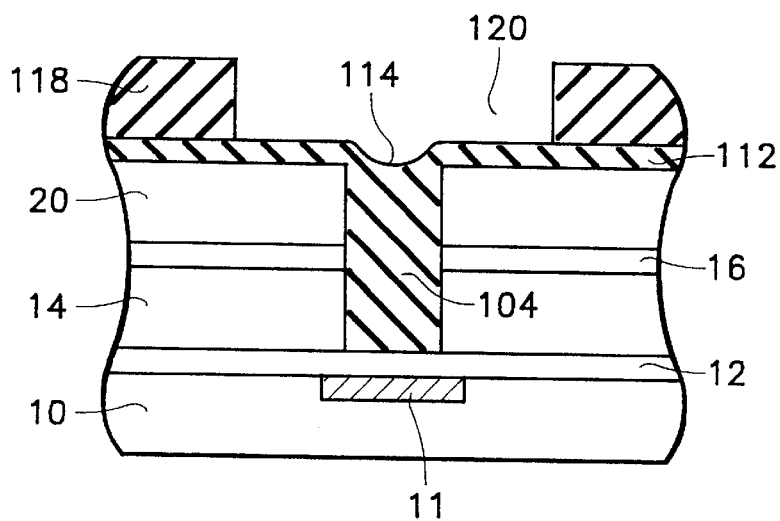

After completion of the dry via etch 102, the wafer is removed from the etch reactor and in a trench ARC coating step 110 a trench anti-reflection coating 112, illustrated in FIG. 7, is deposited. The trench ARC is not as crucial as the via ARC, but it is still advantageous for lithography. Again, it may either be deposited by CVD or spun on. If it is spun on, it will form a substantially flat and thin layer over the top of the upper oxide layer 20 but also substantially fill the extended via hole 104 with perhaps a dimple 114 at the top.

In a trench photomask step 116, a layer 118 of photoresist is deposited and patterned to form a trench aperture 120.

Figure 8:
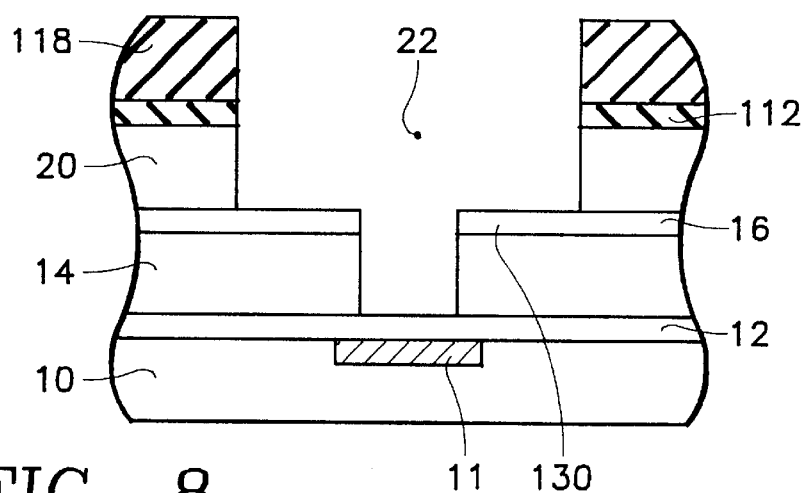
Figure 9:
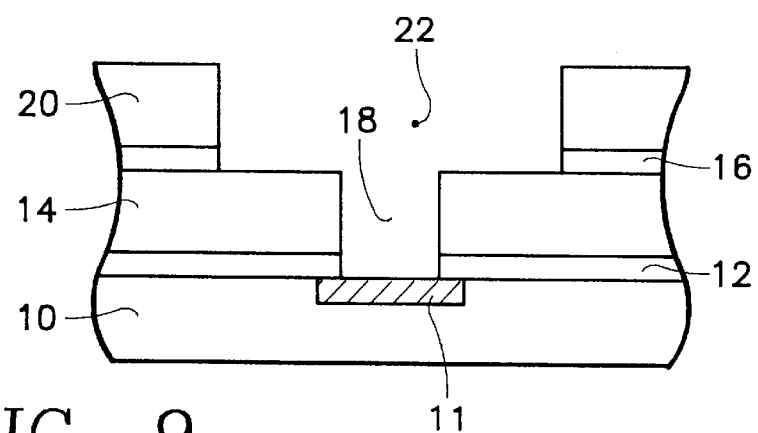

In trench etch step 124, after the top planar portion of the anti-reflection coating 112 is removed, the upper oxide layer 20 is selectively etched, as illustrated in FIG. 8, down to the upper nitride stop layer 16. The oxide etch tends to be selective to BARC, which remains in the extended via hole 104. A final strip and clean step 128 removes the remaining photoresist 118 and anti-reflective coating 112 and produces the structure of FIG. 9 having the final via hole 18. The photoresist 116 and underlying anti-reflective coating 112 and any polymer are removed. Also, the portion of the lower nitride stop layer 12 exposed at the bottom of the via hole 18 and the nitride shoulder 130 at the bottom of the trench 22 are removed. It is preferable that the photoresist and polymer strip be performed prior to the nitride removal. Also, it is advantageous to perform a short dry plasma clean after the nitride removal to eliminate any polymer residue and eliminate the need for a wet clean. The trench etch 124 and strip and clean 128 will be described in more detail later.

Figure 10:
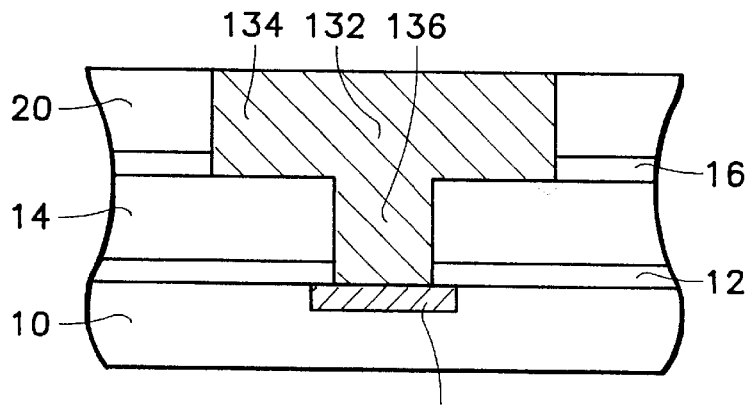

After completion of the dual-damascene etch, as illustrated in FIG. 10, a metal 132, preferably copper, is filled into the dual-damascene etch structure and is polished back to form a horizontally extending interconnect 134 and a vertically extending via 136 contacting the underlying copper line 11.

Figure 11:
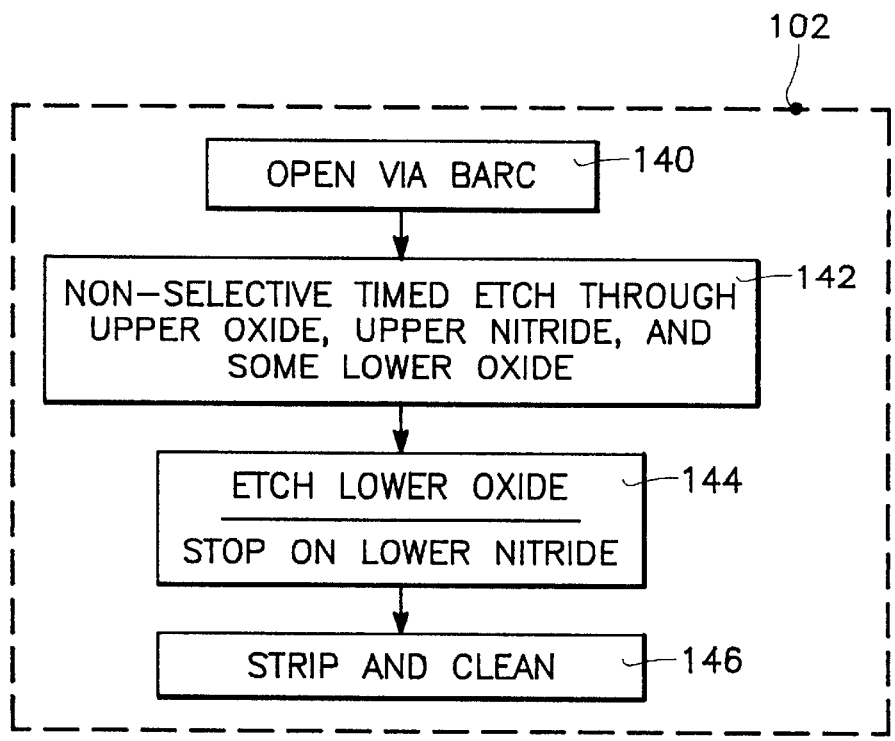
FIG. 11 is a process flow diagram for the counterbore etching part of the process of FIG. 4.

Returning now to the details of the two major etching steps, the deep via etch 102 preferably includes four substeps illustrated in the flow diagram of FIG. 11 and using the exemplary recipe summarized in TABLE 5.

TABLE 5

|  | Open BARC | First Etch Substep | Second Etch Substep | PET |
|---|---|---|---|---|
| CHF$_3$ Flow (sccm) | 0 | 70 | 0 | 0 |
| CH$_2$F$_2$ Flow (sccm) | 0 | 0 | 0 | 0 |
| C$_4$F$_8$ Flow (sccm) | 7 | 0 | 16 | 0 |
| CO Flow (sccm) | 0 | 15 | 0 | 0 |
| O$_2$ Flow (sccm) | 20 | 0 | 0 | 500 |
| Ar Flow (sccm) | 100 | 360 | 200 | 0 |
| Inner Source Power (W) | 340 | 710 | 350 | 750 |
| Outer Source Power (W) | 1020 | 2200 | 1100 | 2150 |

TABLE 5-continued

|  | Open BARC | First Etch Substep | Second Etch Substep | PET |
|---|---|---|---|---|
| Bias Power (W) | 300 | 1400 | 1400 | 0 |
| Pressure (mTorr) | 5 | 65 | 9 | 15 |
| Roof Temp. (° C.) | 180 | 180 | 180 | 180 |
| Ring Temp. (° C.) | 270 | 270 | 270 | 270 |
| Cathode Temp. (° C.) | 15 | 15 | 15 | 15 |
| Backside He Pressure (Torr) | 7 | 7 | 7 | 7 |
| Time (s) | 20 | 50 | 50 | 75 |
| Etch Rate (nm/mm) |  | 850 | 600 |  |

An ARC open step 140 utilizes an oxygen and argon plasma with a little bit of fluorocarbon to open the organic anti-reflective coating 94 beneath the photoresist aperture 100. At least three times as much argon as oxygen is used. The fluorocarbon C$_4$F$_8$ is used to protect the sidewalls of the photoresist 98 and the organic anti-reflective coating 94 with a polymeric layer. If silicon oxynitride were used as the anti-reflective coating, a fluorocarbon would also be needed. Other oxygen-containing gases can be used. Another chemically inactive gas such as nitrogen can be substituted for the argon.

A timed, relatively non-selective oxide etch step 142 etches through the upper oxide layer 20, the upper nitride stop layer 16, and part of the lower oxide layer 14. Carbon monoxide reduces the selectivity to nitride to allow punch through of the upper nitride stop layer 16. This etch is performed at relatively high pressure and bias and with an argon flow much greater than that of the active species. Other fluorocarbons may be used, and other chemically inactive carrier gases may be used instead of argon, especially the rare gases.

A selective oxide etch 144 is then performed to complete the etching of the lower oxide layer 14 and to stop on the lower nitride stop layer 12. Without any CO, the etch becomes selective to nitride. The selectivity is increased by the high argon flow (greater than five times the fluorocarbon flow), the high bias power (more than 50% of the source power), and the hot silicon ring (above 225° C.). The selectivity is also enhanced by the use of a high-density plasma, which also fosters deep etching in a narrow hole. This step uses C$_4$F$_8$ rather than CHF$_3$ as the principal fluorocarbon because C$_4$F$_8$ favors bottom protection while CHF$_3$ favors sidewall protection.

At the completion of the gross etching, a post-etch treatment 146 strips the remaining photoresist and anti-reflective coating and cleans any residue, including polymers, from the structure, eliminating the need for a subsequent wet clean. This post-etch treatment is similar to subsequent ones to be described. It includes an oxygen plasma though other oxygen containing gases may be substituted. It is performed at either zero bias power or at least one no more than 20% of the bias powers during the selective oxide etching step.

All the preceding steps 140, 142, 144, 146 are preferably performed in the same chamber without removing the wafer between the substeps. The plasma need not be extinguished between substeps, and since the temperature remains the same and the pressure varies little, there is little wasted time in the in situ integrated process.

Figure 12:
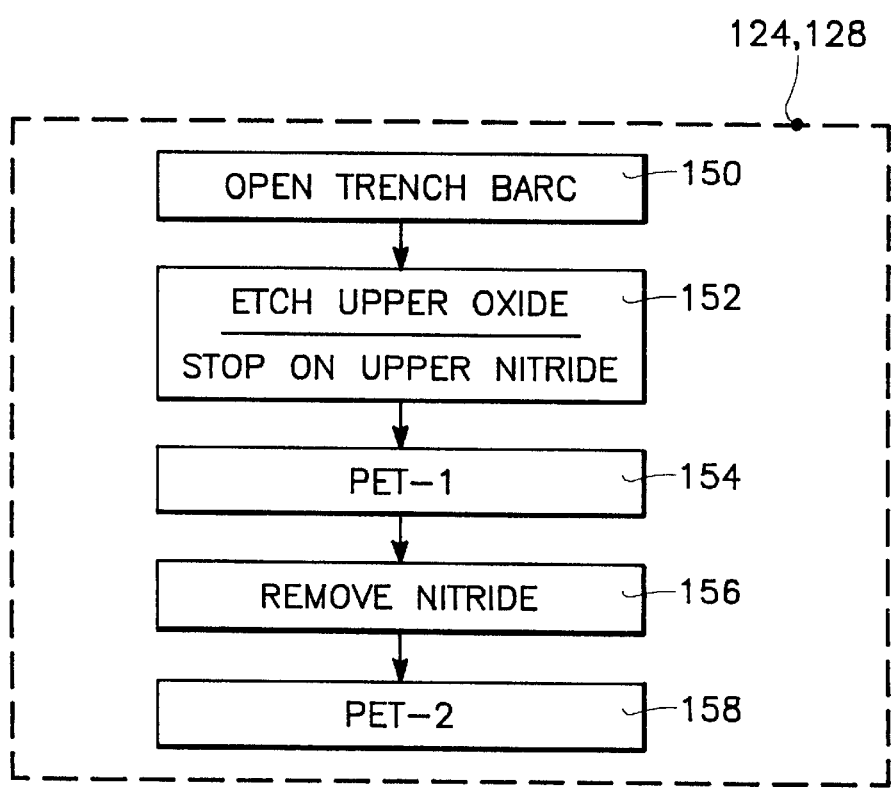
FIG. 12 is a process flow diagram for the trench etching part of the process of FIG. 4.

The trench etch 124 and trench strip and clean 128 preferably includes five substeps, illustrated in the flow diagram of FIG. 12 and using the exemplary parameters of TABLE 6.

TABLE 6

| | Open BARC | Trench Etch | PET-1 | Nitride Removal | PET-2 |
|---|---|---|---|---|---|
| $CHF_3$ Flow (sccm) | 0 | 0 | 0 | 0 | 0 |
| $CH_2F_2$ Flow (sccm) | 0 | 0 | 0 | 10 | 0 |
| $C_4F_8$ Flow (sccm) | 7 | 16 | 0 | 0 | 0 |
| CO Flow (sccm) | 0 | 0 | 0 | 0 | 0 |
| $O_2$ Flow (sccm) | 20 | 0 | 500 | 10 | 500 |
| Ar Flow (sccm) | 100 | 150 | 0 | 300 | 0 |
| Inner Source Power (W) | 340 | 170 | 750 | 500 | 750 |
| Outer Source Power (W) | 1020 | 580 | 2150 | 1500 | 2150 |
| Bias Power (W) | 300 | 1400 | 0 | 300 | 0 |
| Pressure (mTorr) | 5 | 7 | 15 | 15 | 15 |
| Roof Temp. (° C.) | 200 | 200 | 200 | 200 | 200 |
| Ring Temp. (° C.) | 270 | 270 | 270 | 270 | 270 |
| Cathode Temp. (° C.) | 10 | 10 | 10 | 10 | 10 |
| Backside He Pressure (Torr) | 10 | 10 | 10 | 10 | 10 |
| Time (s) | 15 | 50 | 75 | 200 | 10 |
| Etch Rate (nm/min) | | 600 | 600 | 44 | |

A BARC open step 150 utilizes an oxygen and argon plasma to remove the organic trench ARC layer 112 on the top of the upper oxide layer 20 exposed by the trench lithographic aperture 120 and also removes the ARC layer 112 well into the extended via hole 100. The moderate bias and high argon flow produces anisotropic etching. Excessive oxygen in the plasma degrades the profile. Nitrogen or other chemically inactive gases can be substituted for the argon. A selective trench oxide etch 152 etches through the upper oxide layer 20 but stops on the upper nitride stop layer 16. This recipe substitutes $C_4F_8$ for $C_2F_6$ of Hung et al. as the principal fluorocarbon because $C_4F_8$ provides better selectivity to a bottom nitride. The trench oxide etch 152 is performed with a high diluent fraction, greater than 5:1, a high bias power, and a high temperature for the silicon ring, greater than 250°, so as to increase the selectivity to nitride. However, the source power is reduced from that for the counterbore via etch.

After the trench etch 152 has stopped on the lower nitride stop layer 12, a first post-etch treatment 154 is performed to remove the polymeric residues and any remaining photoresist. The post-etch treatment 154 uses an oxygen plasma with no wafer bias and at minimum pressure. A nitride removal step 156 removes the portion of the silicon nitride lower stop layer 12 exposed at the bottom of the via hole 100' as well as the nitride shoulders of the upper nitride stop layer 16 exposed at the bottom of the trench 22. The nitride removal step 156 uses difluoromethane ($CH_2F_2$) as the fluorocarbon for good polymerization to reduce nitride undercutting into both the lower and upper nitride stop layers 12, 16. It also uses an oxygen-containing gas to reduce selectivity to nitride. The bias power is relatively low, less than 25% of the source power and less than 25% of the bias power used in the oxide etch. The low bias power virtually eliminates any copper sputtering once the underlying copper line 11 becomes exposed. It also increases the selectivity of the nitride etch to underlying oxide. A fluorocarbon etch of silicon nitride is primarily a chemical etch while that of silicon oxide is more in the nature of reactive ion etching requiring a high ion energy, that is, high bias power to activate the reaction. Selectivity to oxide is required because, although the copper line 11 is intended to be aligned to the bottom of the via hole 18, inter-level mis-alignment may cause the copper line 11 to be shifted toward one side of the bottom of the via hole 100' with the lower-level oxide underlying the other side. Etching of the underlying oxide alongside the copper feature has two problems. Deposition of the subsequent sputter Ta/TaN barrier layer may not reach such a narrow feature and permit the subsequently deposited copper to directly contact the oxide. Furthermore, the widened copper feature 11 may cause excessive cross talk or even shorting to a neighboring copper feature. Reasonable selectivity to oxide will prevent these problems, particularly in view of the more isotropic etching conditions prevailing with the oxygen and low bias power. Increased selectivity to oxide also prevents etching of the lower dielectric layer exposed at the bottom of the trench.

After the nitride removal 156, another short post-etch treatment 158 is performed. It has the same conditions as the first post-etch treatment 154 but the time is reduced from 75 s to 10 s. Its primary function is to remove the polymeric residues formed during the nitride removal 156. The second post-etch treatment 158 eliminates the need for a wet clean prior to the next processing step.

The two post-etch treatments 154, 158 are particularly advantageous for copper metallization because the first and heavier treatment cannot deposit residue on the copper and the second, short treatment exposes the copper to oxygen for a relatively short time.

Further tests were made to control the nitride undercutting in the nitride removal. Ranges which were studied include 10 to 30 sccm of $O_2$, 10 to 30 sccm of $CH_2F_2$, 9 to 60 mT of pressure, and 150 to 300 W of bias power. These tests show that nitride undercutting is reduced at lower $CH_2F_2$ flows, high bias power, and lower pressure.

Although the above trench etch sequence has been found effective, the amount of nitride undercutting is still excessive. It occurs at both the upper and lower nitride stop layer. Furthermore, once the upper nitride stop layer has been removed at the bottom of the trench, the underlying lower oxide layer is exposed. The nitride removal using $CH_2F_2$ is insufficiently selective to oxide and tends to remove some of the lower oxide layer beneath the trench. According a variant has been developed using the more heavily polymerizing monofluoromethane ($CH_3F$) as the principal fluorocarbon in the nitride removal 146.

TABLE 7 presents the gas flows and parameters changed from those of TABLE 6 for the modified nitride removal.

TABLE 7

| | Nitride Removal |
|---|---|
| $CH_3F$ Flow (sccm) | 30 |
| $O_2$ Flow (sccm) | 5 |
| Ar Flow (sccm) | 50 |
| Bias Power (W) | 200 |
| Time (s) | 70 |
| Etch Rate (nm/min) | 80 |

The very heavy polymerization of $CH_3F$ eliminates any observable nitride undercutting. The further reduction in bias power yet further protects against copper sputtering. Further window experiments were conducted. The general conclusions are that increased $CH_3F$ flow decreases the undercutting and increases the selectivity to oxide. On the other hand, increased $O_2$ flow greatly increases the undercutting and reduces the selectivity to oxide.

Increased

Using the above processing sequence, including the modification of TABLE 7, copper vias were fabricated and tested. No nitride undercutting and no copper sputtering were observed. The via resistance was approximately 0.4 Ω for a 0.5 µm via and 1.3 Ω for a 0.25 µm via.

Although the invention has been described in the context of a dual-damascene structure, it is not so limited. For example, a deep via etch over a nitride stop layer can use the counterbore via etch chemistry followed by the two post-etch treatments and nitride removal described for the trench etch.

The invention more generally includes other combinations of dielectric and stop materials for an in situ integrated process, for example, low-k dielectrics such as bivinylcyclobutene (BCB) available from Dow Chemical and Black Diamond as described in U.S. patent applications Ser. Nos. 09/021,788 filed Feb. 11, 1998 and 09/114,682 filed Jul. 13, 1998. Differential etching of these materials is described in U.S. patent applications Ser. Nos. 09/156,956 filed Sep. 18, 1998 and 09/200,086, filed Nov. 25, 1998.

Although the invention is particularly advantageous for counterbore dual-damascene structures, it may be applied to other structures including other types of damascene structures and more conventional vias.

The invention has been described as being practices in an IPS chamber, it may be advantageously performed in other types of inductively coupled plasma reactors and other types of reactors, such as remote plasma source and ECR, in which the source plasma is separately controlled from the bias.

The invention is particularly advantageous for copper metallizations, but many features of the invention are applicable to other metallizations, including the conventional aluminum.

The invention thus provides high-performance, high-throughput integrated etch processes with tools already commercially available and using common etching gases. It further eliminates the need for a wet clean.

What is claimed is:

1. An integrated etch process performed upon a substrate having formed sequentially in an upward direction (a) a feature in said substrate to be contacted, (b) a first stop layer, (c) a first dielectric layer, and (d) a patterned mask, said process comprising the steps of:
    a first plasma etching step utilizing a first etching gas mixture comprising a first fluorocarbon etching gas and a carrier gas and operating with a first plasma source power and a first plasma bias power, wherein said first etching step etches through said first dielectric layer and stops on said first stop layer; and
    a first plasma treatment utilizing a first oxygen-containing gas and operating with a second plasma source power value and a second plasma bias power value that is effectively zero, said first plasma treatment removing polymeric residues produced by said first fluorocarbon etching gas;
    a second plasma etching step utilizing a second etching gas mixture comprising a second fluorocarbon etching gas and an oxygen-containing gas and operating with a third plasma source power value and a third plasma bias power value less than said first plasma bias power value, said second plasma etching step removing an exposed portion of said first stop layer; and
    a second plasma treatment utilizing a second oxygen-containing gas and operating with a fourth plasma source power value and a fourth plasma bias power value that is effectively zero, said second plasma treatment removing polymeric residues produced by said second fluorocarbon etching gas.

2. The process of claim 1, wherein said first dielectric layer comprises an oxide and said stop layer comprises a nitride.

3. The process of claim 2, wherein said second fluorocarbon etching gas comprises monofluoromethane.

4. The process of claim 3, wherein said oxygen-containing gas is oxygen gas.

5. The process of claim 1, wherein said substrate further comprises an anti-reflection coating disposed between said patterned mask and said first dielectric layer, said process further comprising a third plasma etching step performed before said first plasma etching step of utilizing a third etching gas mixture comprising an oxygen-containing gas, a fluorocarbon gas, and a carrier gas with a fifth plasma source power value and a fifth plasma bias power value.

6. The process of claim 5, wherein said third etching step further comprises utilizing a fluorocarbon.

7. The process of claim 6, wherein said anti-reflective coating comprises an organic polymer.

8. The process of claim 5, wherein said anti-reflective coating comprises silicon oxynitride.

9. The process of claim 1, wherein said integrated etch process is performed in a single plasma etch reactor having separately controlled plasma source power and plasma bias power.

10. The process of claim 1, wherein during said second plasma treatment step said fourth plasma bias power value is maintained as long as said second oxygen-containing gas is supplied.

11. The process of claim 1, wherein said first plasma treatment step removes any remaining portion of said patterned mask.

12. The process of claim 1, wherein said second plasma etching step additionally utilizes a carrier gas.

13. An integrated etch process for a counterbore dual-damascene structure comprising:
    a counterbore via etch performed upon a substrate having formed sequentially in an upward direction a lower nitride layer, an upper oxide dielectric layer, a first anti-reflective coating, and a first mask patterned for via hole; and
    a trench etch performed upon said substrate after said counterbore via etch and having formed over said upper oxide layer a second anti-reflective coating and a second mask patterned for a trench surrounding said via hole;
    wherein said counterbore via etch comprises
        opening said first anti-reflective coating,
        etching through said upper oxide layer and said upper nitride layer,
        etching through said lower oxide layer but stopping on said lower nitride layer with an etching gas comprising a fluorocarbon and argon, and
        a first post-etch treatment using an oxygen plasma; and
    wherein said trench etch comprises
        opening said second anti-reflective coating,
        etching through said upper oxide layer but stopping on said upper nitride layer with an etching gas comprising a fluorocarbon and a chemically inactive gas and with a first plasma bias power value,
        a second post-etch treatment using an oxygen plasma,
        etching through said upper nitride layer with an etching gas comprising a fluorocarbon, an oxygen-containing gas, and a chemically inactive gas and with a second plasma bias power value substantially less than said first plasma bias power value, and a third post-etch treatment using an oxygen plasma and effectively a zero plasma bias power value.

14. The process of claim 13, wherein said counterbore via etch is performed in a single first plasma etch reactor having separately controlled plasma source power and plasma bias power and wherein said trench etch is performed in a single second plasma etch reactor, which may be the same as said first reactor, having separately controlled plasma source power and plasma bias power.

15. The process of claim 13,
wherein said step in said counterbore via etch of etching through said upper oxide layer and said upper nitride layer utilizes a first etching mixture comprising a first fluorocarbon etch gas and a carrier gas and operating with a first plasma source power and a first plasma bias power;
further comprising an effectively immediately following first plasma treatment utilizing a first oxygen-containing gas and operating with a second plasma source power value and a second plasma bias power value that is effectively zero; and
wherein said step in said counterbore via etch of etching through said lower oxide layer additionally utilizes an oxygen-containing gas and operating with a third plasma source power value and a third plasma bias power value less than said first plasma bias power value.

16. The process of claim 13, wherein said first post-etch treatment operates with a bias power value that is effectively zero.

17. An integrated etch process performed in a single plasma etch reactor having separately controlled plasma source power and plasma bias power and performed upon a substrate having formed sequentially in an upward direction (a) a stop layer, (b) a first first dielectric layer, and (c) an anti-reflection coating, said process comprising the steps of:
opening the anti-reflection coating with a first oxygen-containing plasma of a first gas mixture comprising a first oxygen-containing gas and a first fluorocarbon gas;
selectively etching said dielectric layer with a plasma of a second gas mixture comprising a second fluorocarbon gas and a larger amount of a chemically inactive gas and using a first plasma bias power value, said etching stopping on said stop layer;
removing said stop layer with a second oxygen-containing plasma and using a second plasma bias power value; and
a subsequent plasma treatment utilizing a third oxygen-containing plasma, wherein said plasma bias power applied during said plasma treatment is effectively zero.

18. The process of claim 17, wherein said selectively etching step produces a high-density plasma.

19. The process of claim 17, wherein said second fluorocarbon gas comprises a hydrogen-free fluorocarbon.

20. The process of claim 17, wherein said first gas mixture additionally comprises argon.

21. The process of claim 17, wherein said anti-reflection coating comprises an organic polymer.

22. The process of claim 17, wherein said anti-reflection coating comprises silicon oxynitride.

23. The process of claim 17, wherein said third oxygen-containing plasma is formed from a gas consisting essentially of oxygen gas.

24. The process of claim 17, wherein said first plasma bias power value is less than said first plasma bias power value.

* * * * *